(12) United States Patent  
Chien et al.

(10) Patent No.: US 9,401,429 B2
(45) Date of Patent: Jul. 26, 2016

(54) SEMICONDUCTOR STRUCTURE AND PROCESS THEREOF

(71) Applicant: UNITED MICROELECTRONICS CORP., Hsin-Chu (TW)

(72) Inventors: Chin-Cheng Chien, Tainan (TW); Chun-Yuan Wu, Yun-Lin County (TW); Chin-Fu Lin, Tainan (TW); Chih-Chien Liu, Taipei (TW); Chia-Lin Hsu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 97 days.

(21) Appl. No.: 13/917,623

(22) Filed: Jun. 13, 2013

(65) Prior Publication Data

US 2014/0367779 A1    Dec. 18, 2014

(51) Int. Cl.
*H01L 29/78* (2006.01)
*H01L 29/66* (2006.01)
*H01L 29/423* (2006.01)
*H01L 29/786* (2006.01)

(52) U.S. Cl.
CPC ........ *H01L 29/785* (2013.01); *H01L 29/42392* (2013.01); *H01L 29/66795* (2013.01); *H01L 29/78696* (2013.01)

(58) Field of Classification Search
CPC .................. H01L 29/66795; H01L 29/42392; H01L 29/785; H01L 29/78696; H01L 27/1211; H01L 21/845; H01L 29/66818; H01L 21/823431; H01L 27/0886; H01L 21/823821; H01L 2924/13067; H01L 2029/7858; H01L 29/1033
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |

(Continued)

*Primary Examiner* — Steven Loke
*Assistant Examiner* — Leslie Pilar Cruz
(74) *Attorney, Agent, or Firm* — Winston Hsu; Scott Margo

(57) ABSTRACT

A semiconductor structure includes a fin-shaped structure and a gate. The fin-shaped structure is located in a substrate, wherein the fin-shaped structure has a through hole located right below a suspended part. The gate surrounds the suspended part. Moreover, the present invention also provides a semiconductor process including the following steps for forming said semiconductor structure. A substrate is provided. A fin-shaped structure is formed in the substrate, wherein the fin-shaped structure has a bottom part and a top part. A part of the bottom part is removed to form a suspended part in the corresponding top part, thereby forming the suspended part over a through hole. A gate is formed to surround the suspended part.

19 Claims, 5 Drawing Sheets

(56) References Cited

U.S. PATENT DOCUMENTS

| | | |
|---|---|---|
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |
| 2011/0165738 A1* | 7/2011 | Tezuka ............... H01L 27/1211 438/150 |
| 2012/0012934 A1* | 1/2012 | Shah et al. .................... 257/347 |
| 2013/0341704 A1* | 12/2013 | Rachmady ........ H01L 29/66545 257/327 |

* cited by examiner

SEMICONDUCTOR STRUCTURE AND PROCESS THEREOF

BACKGROUND OF THE INVENTION

1. Field of the Invention

The present invention relates generally to a semiconductor structure and a process thereof, and more specifically to a semiconductor structure having four gate channels and a process thereof.

2. Description of the Prior Art

With the increasing miniaturization of semiconductor devices, various Multi-gate MOSFET devices have been developed. The Multi-gate MOSFET is advantageous for the following reasons. First, the manufacturing processes of the Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This therefore reduces the drain-induced barrier lowering (DIBL) effect and the short channel effect. Moreover, the channel region is longer for a similar gate length. Therefore, the current between the source and the drain is increased.

Multi-gate MOSFETs all have fin-shaped structures, and gates are disposed on the fin-shaped structures to form the three dimensional MOSFETs (which are different from the planar MOSFETs). The height of the fin-shaped structures and the width of the gates disposed on the fin-shaped structures will affect the width and the length of the gate channels of the multi-gate MOSFETs. In the layouts of integrated circuits, the purposes of each multi-gate MOSFETs are different and the electrical requirements for these MOSFETS are therefore different as well, thereby leading these corresponding fin-shaped structures to have different heights. However, the different heights of the fin-shaped structures increase the processing difficulties, and therefore increase the number of problems during the processes, such as over-polishing or insufficient polishing of the gates disposed across each of the fin-shaped structures.

SUMMARY OF THE INVENTION

The present invention provides a semiconductor structure and a process thereof that removes parts of a fin-shaped structure to form a suspended part of the fin-shaped structure, and then forms a gate surrounding the suspended part so as to form a semiconductor structure having four gate channels.

The present invention provides a semiconductor structure including a fin-shaped structure and a gate. The fin-shaped structure is located in a substrate, wherein the fin-shaped structure has a through hole located right below a suspended part. The gate surrounds the suspended part.

The present invention provides a semiconductor process including the following steps. A substrate is provided. A fin-shaped structure is formed in the substrate, wherein the fin-shaped structure has a bottom part and a top part. A part of the bottom part is removed, so that a suspended part in the corresponding top part is formed over a through hole. A gate is formed to surround the suspended part.

According to the above, the present invention provides a semiconductor structure and a process thereof that removes parts of a fin-shaped structure to form a through hole for forming a suspended part of the fin-shaped structure correspondingly above the through hole; and then, a gate surrounds the suspended part, thereby forming a semiconductor structure having four gate channels. Moreover, a formed semiconductor structure such as a multi-gate MOSFET can achieve different desired electrical requirements by adjusting the depth and the width of the suspended part.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
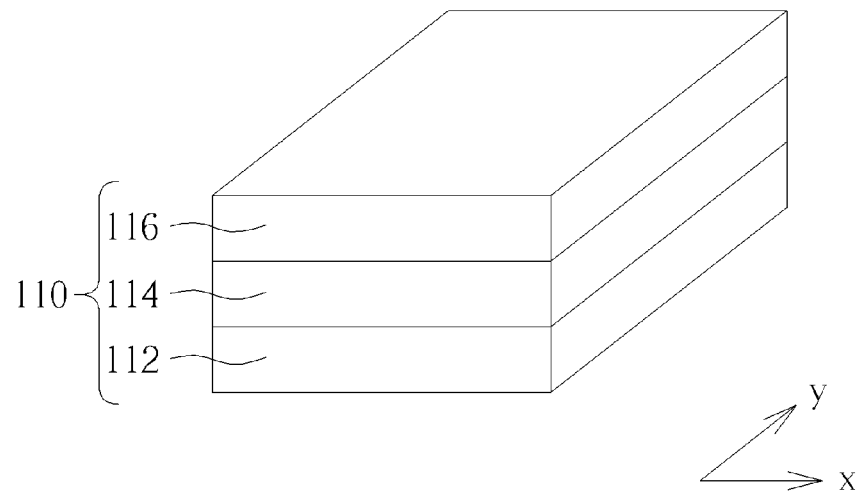
FIG. 1 schematically depicts a three-dimensional view of a semiconductor process according to an embodiment of the present invention.

FIG. 1 schematically depicts a three-dimensional view of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110 is a silicon-on-insulator (SOI) substrate, and therefore includes a base 112, an insulating layer 114 and a silicon layer 116 from bottom to top. The insulating layer 114 electrically isolates the base 112 and the silicon layer 116, so that currents from components such as transistors formed on the silicon layer 116 will not leak downward to the base 112. The insulating layer 114 may be an oxide layer, but it is not limited thereto. To clarify the present invention, a direction x and a direction y perpendicular to each other are depicted in FIG. 1.

FIGS. 2-5, 7-9 schematically depict top views and cross-sectional views of a semiconductor process according to an embodiment of the present invention, wherein the top views and cross-sectional views are depicted along the direction x and the direction y of FIG. 1.

Figure 2:
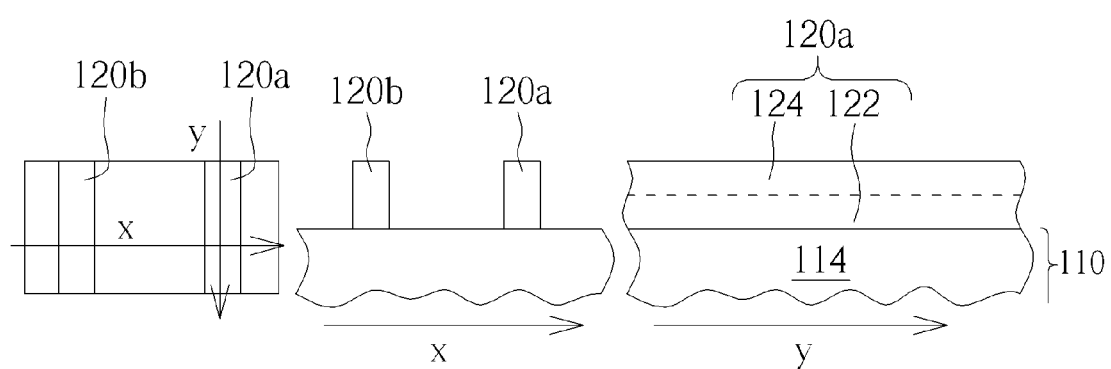
FIGS. 2-5, 7-9 schematically depict top views and cross-sectional views of a semiconductor process according to an embodiment of the present invention.

As shown in FIG. 2, two fin-shaped structures 120a and 120b are formed in the substrate 110. In this embodiment, parts of the silicon layer 116 are removed to form the fin-shaped structures 120a and 120b. More precisely, a hard mask such as a photoresist (not shown) covers the silicon layer 116 and is patterned to define the positions of the fin-shaped structures 120a and 120b. The silicon layer 116 is etched and then the hard mask is removed to form the fin-shaped structures 120a and 120b in the substrate 110. In this embodiment, the fin-shaped structure 120a is divided into a bottom part 122 and a top part 124. A dash line between the bottom part 122 and the top part 124 is depicted to represent the two parts, which does not exist in the real structure. There are two fin-shaped structures 120a and 120b in this embodiment, and a multi-gate MOSFET having four gate channels is formed on the fin-shaped structure 120a, while a multi-gate MOSFET having three gate channels is formed on the fin-shaped structure 120b, but it is not limited thereto. In another embodiment, two multi-gate MOSFETs having four gate channels may be formed instead, which gate channels may have common or different widths or lengths; or, a multi-gate MOSFET having four gate channels is formed on the fin-shaped structure 120a while a multi-gate MOSFET having two gate channels is formed on the fin-shaped structure 120b, but it is not limited thereto. In this way, the multi-gate MOSFET having four gate channels of the present invention can be integrated into a layout having various multi-gate MOSFETs, a layout having planar MOSFETs, or other semiconductor layouts.

Figure 3:
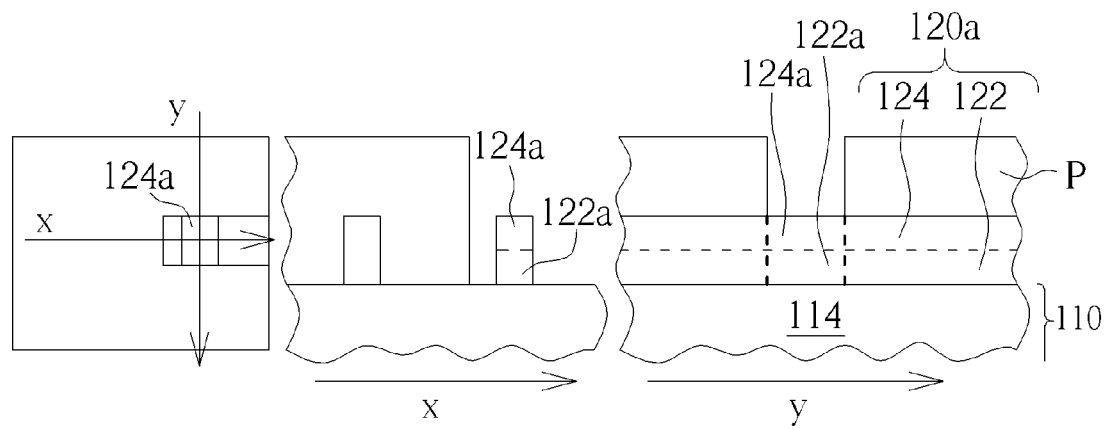
Figure 4:
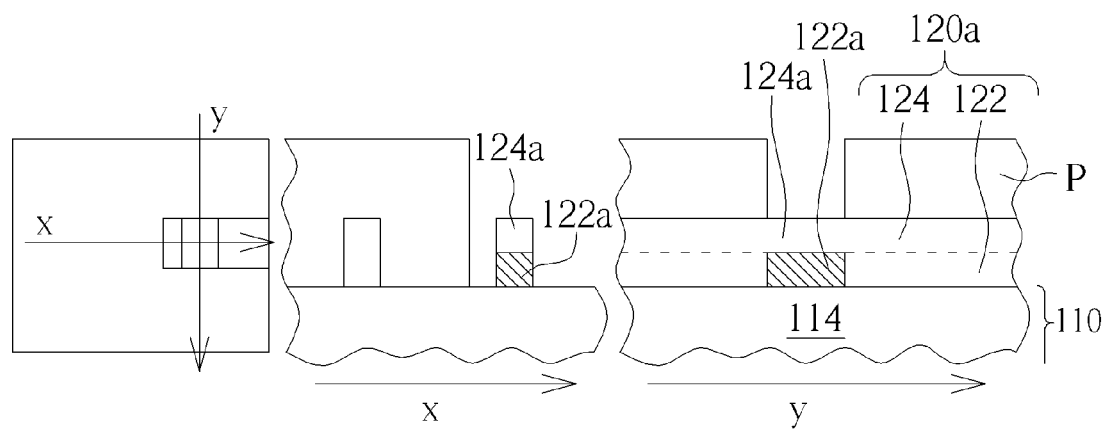
Figure 5:
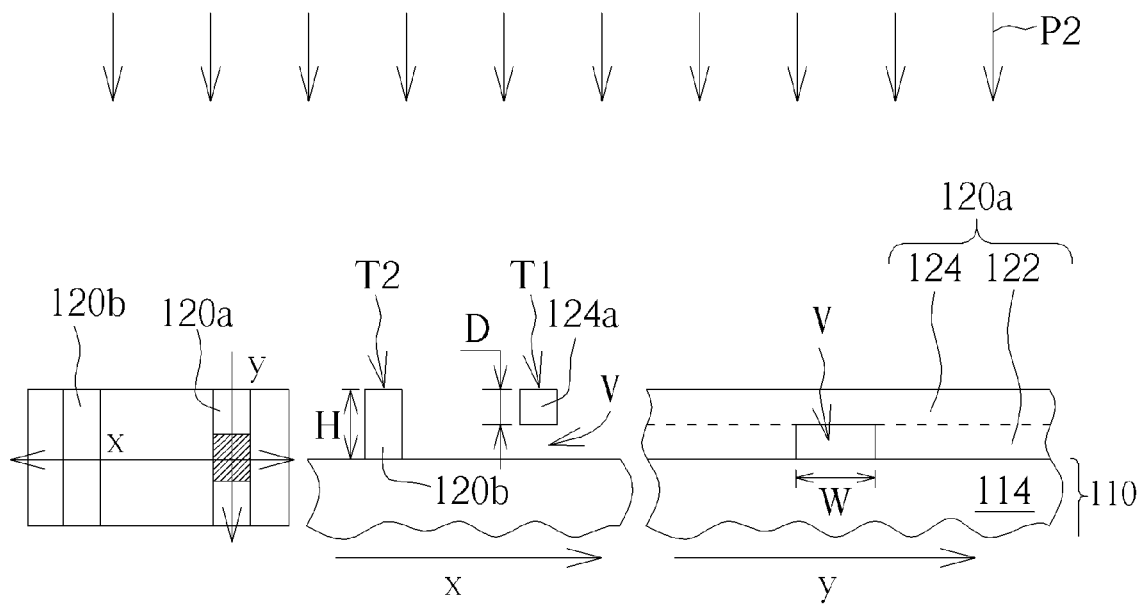

As shown in FIGS. 3-5, a part 122a of the bottom part 122 is removed to form a suspended part 124a in the above corresponding top part 124; the suspended part 124a is therefore located over a through hole V. For example, as shown in FIG. 3, a hard mask, such as a photoresist (not shown), is formed to cover the substrate 110 and the fin-shaped structures 120a and 120b, and then the photoresist is patterned to form a patterned photoresist P covering the substrate 110 and the fin-shaped structures 120a and 120b wherein the patterned photoresist P has an opening exposing the desired parts for forming the suspended part 124a and the through hole V in the fin-shaped structure 120a(i.e. the part 122a of the bottom part 122 is replaced by the through hole V and the suspended part 124a is disposed in the above corresponding top part 124). As shown in FIG. 4, a transformation process P1 is performed to transform the part 122a of the bottom part 122 that is exposed by the opening. A removing process P2 is performed to remove the part 122a of the bottom part 122 that has been transformed, as shown in FIG. 5. In other words, the non-transformed parts can be covered by the photoresist while the part 122a is exposed; then, the transformation process P1 is performed to transform the part 122a into another material; and then, the part 122a is removed through a process having an etching selectivity to the part 122a and the other parts of the fin-shaped structure 120a; i.e. the etching rate of the etching process of the part 122a is different from that of the other parts of the fin-shaped structure 120a. Thus, a top surface T1 of the suspended part 124a is disposed at the same height H as a top surface T2 of the fin-shaped structure 120b, thereby improving the uniformity of a process performed simultaneously on the suspended part 124a and the fin-shaped structure 120b. Moreover, when the heights of the suspended part 124a and the fin-shaped structure 120b are the same and are fixed, the size of the through hole V can be controlled to adjust the depth D and the width W of the suspended part 124a, so that the electrical requirements can be achieved.

In this embodiment, the transformation process P1 is an ion implantation process. Preferably, the transformation process P1 is a germanium ion implantation process, and germanium ions can penetrate the suspended part 124a of the fin-shaped structure 120a down to the part 122a of the bottom part 122 by adjusting the implantation energy of the ion implantation process; then, the removing process P2 having etching selectivity to germanium, such as a dry etching process importing organic compounds containing fluorine (which chemistry formula could be CHXFy), can be performed, but it is not limited thereto. In this way, the etching selectivity of the dry etching process importing organic compounds containing fluorine to the part 122a and to the other parts (i.e. the suspended part 124a) of the fin-shaped structure 120a can be adjusted by controlling the imported germanium concentration, thereby obtaining an etching selectivity form 10:1 to 40:1, depending upon the needs. In another embodiment, the transformation process P1 may comprise other modification processes, such as implanting ions into the suspended part 124a of the fin-shaped structure 120a without implanting ions into the part 122a of the bottom part 122, so the part 122a can be removed because of the etching selectivity between the part 122a and the suspended part 124a; or, such as implanting the part 122a through other kinds of ion implantation processes. The removing process for removing the modified part 122a may comprise other processes, such as a dry etching process or/and a wet etching process etc.

Figure 6:
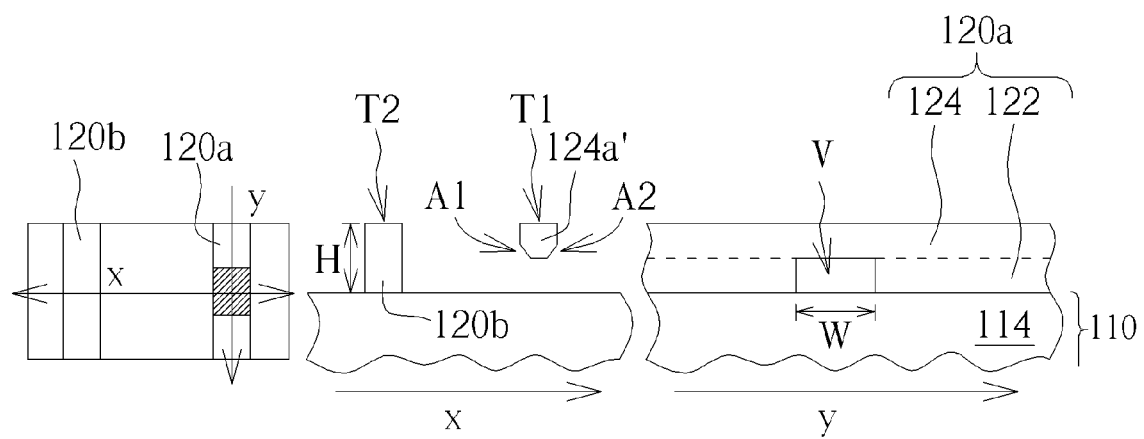
FIG. 6 schematically depicts a top view and a cross-sectional view of a semiconductor structure according to another embodiment of the present invention.

Above all, after the part 122a is removed, the through hole V is formed in the bottom part 122 of the fin-shaped structure 120a and the suspended part 124a is therefore formed in the corresponding top part 124 right above the through hole V. The cross-sectional profile of the suspended part 124a along the direction x may be a rectangle (as shown in FIG. 5) or other shapes, depending upon the transformation process P1 and the removing process P2. In a preferred embodiment, as shown in FIG. 6, a bottom surface of the suspended part 124a' can have two chamfers A1 and A2 to prevent the electrical field from concentrating and discharging in corners having right angles when the suspended part 124a' serves as gate channels of a MOSFET. The chamfers A1 and A2 may be formed during said removing process P2. For example, the removing process P2 may have larger etching rates along some specific crystal planes, therefore the chamfers A1 and A2 can be formed at the same time when the part 122a is removed. In another way, the part 122a may be removed during the removing process P2 to form the suspended part 124a having a rectangular shaped cross sectional profile as shown in FIG. 5; then, another removing process, such as a wet etching process, may be performed to keep forming the suspended part 124a' having the two chamfers A1 and A2. Furthermore, a top surface of the suspended part 124a' may also be etched by the removing processes and therefore form two chamfers.

Figure 7:
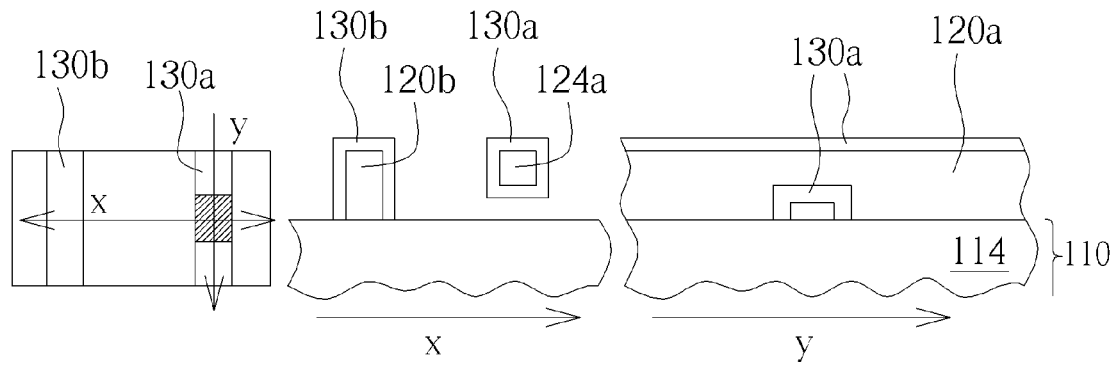
Figure 8:
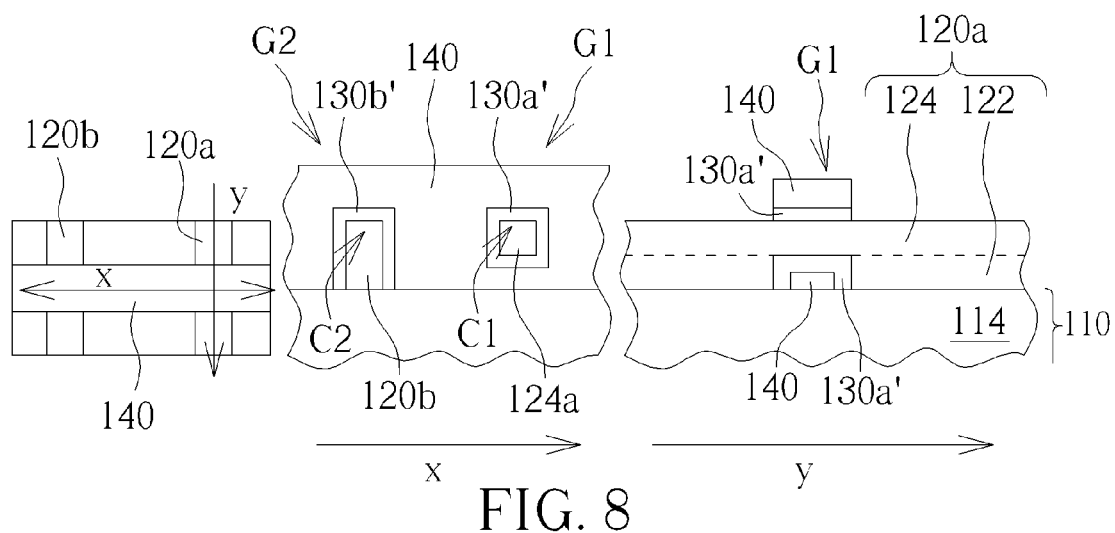

As shown in FIGS. 7-8, a gate G1 and a gate G2 are formed to be disposed across the fin-shaped structures 120a and 120b respectively. The gate G1 surrounds the suspended part 124a, and preferably fills up the through hole V of FIG. 5.

More precisely, as shown in FIG. 7, two dielectric layers 130a and 130b are formed to cover the fin-shaped structures 120a and 120b respectively. Since the fin-shaped structure 120a comprises the suspended part 124a, the dielectric layer 130a will surround the suspended part 124a. In other words, the dielectric layer 130a has a rectangular frame shaped cross sectional profile along the direction X, while the dielectric layer 130b has an inverted U-shaped cross sectional profile along the direction X. The dielectric layers 130a and 130b may be formed by performing an atomic layer deposition (ALD) process for forming dielectric layers with thinner thicknesses, but it is not limited thereto.

The dielectric layers 130a or 130b may comprise an oxide layer, a buffer layer or/and a dielectric layer having a high dielectric constant etc, depending upon the paired semiconductor process. For example, when the present invention uses a polysilicon gate process, the dielectric layer 130a or 130b is a dielectric suitable for a polysilicon gate such as an oxide layer; when the present invention uses a gate-first process or a gate-last for high-K first process, the dielectric layer 130a or 130b may include a buffer layer and a dielectric layer having a high dielectric constant; when the present invention uses a gate-last for high-K last with a buffer layer first process, the dielectric layer 130a or 130b may include a buffer layer and a sacrificial dielectric layer, wherein the sacrificial dielectric layer is replaced by a dielectric layer having a high dielectric constant in a later performed metal gate replacement process; when the present invention uses a gate-last for high-K last with a buffer layer last process, the dielectric layer 130a or 130b may be a sacrificial dielectric layer, wherein the sacrificial dielectric layer is replaced by a buffer layer and a dielectric layer having a high dielectric constant in a later performed metal gate replacement process. In this embodiment, the present invention uses a gate-last for high-K first process, and the dielectric layer 122 may include a buffer layer and a dielectric layer having a high dielectric constant. The buffer layer may be an oxide layer, which may be formed through a chemical oxide process, a thermal oxide process, or other processes, for buffering the dielectric layer having a high dielectric constant and the substrate 110. The dielectric layer having a high dielectric constant may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The electrode layer 124 may be a polysilicon layer. The cap layer 126 may be a single layer or multilayer structure composed of nitride or oxide.

As shown in FIG. 8, an electrode layer (not shown) and a selective cap layer (not shown) may be sequentially formed to entirely cover the fin-shaped structures 120a and 120b and the substrate 110; then, the selective cap layer, the electrode layer and the dielectric layers 130a and 130b are patterned to form the gate G1 and G2 while exposing other parts of the fin-shaped structures 120a and 120b. At this time, the electrode layer 140 of the gates G1 and G2 is disposed across the fin-shaped structures 120a and 120b simultaneously. The gate G1 may include a gate dielectric layer 130a' surrounding the suspended part 124a and the electrode layer 140 covering the gate dielectric layer 130a', wherein the gate dielectric layer 130a' has a rectangular frame shaped cross sectional profile along the direction X (or a hexagonal frame shaped cross sectional profile or an octagonal frame shaped cross sectional profile because of the chamfers mentioned before), and the gate G1 also has a rectangular frame shaped cross sectional profile along the direction X (or a hexagonal frame shaped cross sectional profile or an octagonal frame shaped cross sectional profile because of the chamfers mentioned before), so the gate G1 has four gate channels C1 (or six gate channels or eight gate channels because of the chamfers mentioned before). Preferably, the gate G1 surrounds the suspended part 124a and fills the through hole V of FIG. 5. The gate G2 may include a gate dielectric layer 130b' and the electrode layer 140 covering the gate dielectric layer 130b', wherein the gate dielectric layer 130b' has an inverted U-shaped cross sectional profile along the direction X, so the gate G2 has three gate channels C2. The electrode layer 140 may be composed of materials such as polysilicon or metal. When the electrode layer 140 is composed of polysilicon, the gates G1 and G2 are polysilicon gates. When the electrode layer 140 is composed of metal, the gates G1 and G2 are metal gates. Since a gate last for high-K first process is used in this embodiment, the electrode layer 140 is a polysilicon electrode layer, and the gates G1 and G2 are polysilicon gates. Therefore, the electrode layer may be formed through an atomic layer deposition (ALD) process, but it is not limited thereto. The selective cap layer may be a nitride layer or an oxide layer, but it is not limited thereto. The electrode layer 140 is just a sacrificial gate and will be replaced by a metal gate through a replacement metal gate (RMG) process; in other words, the whole electrode layer 140 may be replaced by metal in later processes.

Figure 9:
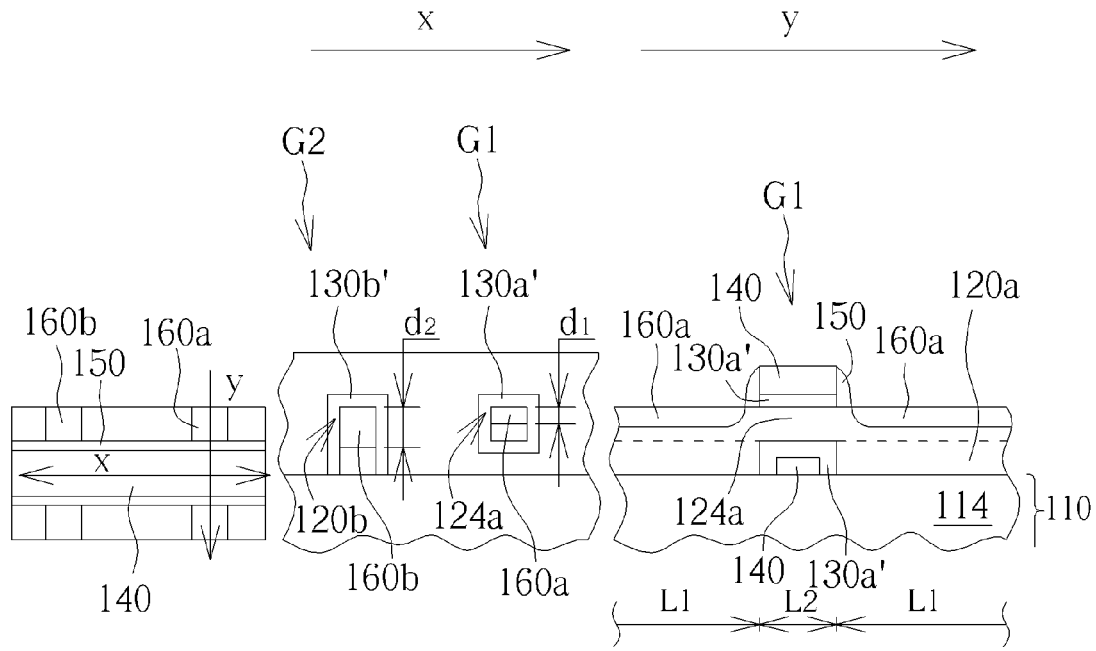

As shown in FIG. 9, a lightly doped source/drain (not shown) may be formed in the fin-shaped structures 120a and 120b, and then a spacer 150 may be formed on the fin-shaped structures 120a and 120b and the substrate 110 beside the electrode layer 140. Thereafter, a source/drain 160a is formed in the fin-shaped structures 120a beside the spacer 150, while a source/drain 160b is formed in the fin-shaped structures 120b beside the spacer 150. The spacer 150 may be a nitride layer or an oxide layer; the lightly doped source/drain or the source/drain 160a and 160b may be formed by implanting trivalent or pentavalent ions such as boron or phosphorous, depending upon the electrical type of the formed transistor, but it is not limited thereto. The length L1 of the source/drain 160a in a cross-sectional view along the direction y is larger than the length L2 of the suspended part 124a in a cross-sectional view along the direction y. Moreover, since the gate G1 has the electrode layer 140 that fills the space right below the suspended part 124a, (which is different from the gate G2), the source/drain 160a and 160b can be respectively formed to have a depth d1 of the source/drain 160a smaller than a depth d2 of the source/drain 160b.

Thereafter, later semiconductor processes such as a replacement metal gate (RMG) process may be performed. For instance, an interdielectric layer (not shown) may be covered and planarized until the electrode layer 140 is exposed; the electrode layer 140 is removed to expose the dielectric layers 130a' and 130b'; metal is filled to form the gates G1 and G2 as metal gates.

According to the above, since the present invention forms a four gate channels MOSFET (or a six or eight gate channels MOSFET by forming chamfers as mentioned before), it can have a smaller size while having the same electrical performances compared to a dual gate channels or three gate channels MOSFET. More precisely, the electrical performances of the four gate channels MOSFET (or the six or eight gate channels MOSFET) can be achieved by adjusting the size of the suspended part 124a, which determines the size of the gate channels C1.

Moreover, the four gate channels MOSFET (or the six or eight gate channels MOSFET) of the present invention can be paired with a dual gate channels or three gate channels MOSFET or a planar MOSFET to form an integrated circuit layout, depending upon the needs. Therefore, when MOSFETs having different electrical properties for achieving different purposes need to be formed, the four gate channels MOSFET (or the six or eight gate channels MOSFET) of the present invention can be used. Preferably, the four gate channels MOSFET (or the six or eight gate channel MOSFET) of the present invention has the same height as other MOSFETs such as a dual gate channel or three gate channel MOSFET etc. Therefore, the processing qualities such as the uniformity of a polishing process can be improved, and the electrical performances and reliability of a formed semiconductor structure can therefore be enhanced.

Figure 10:
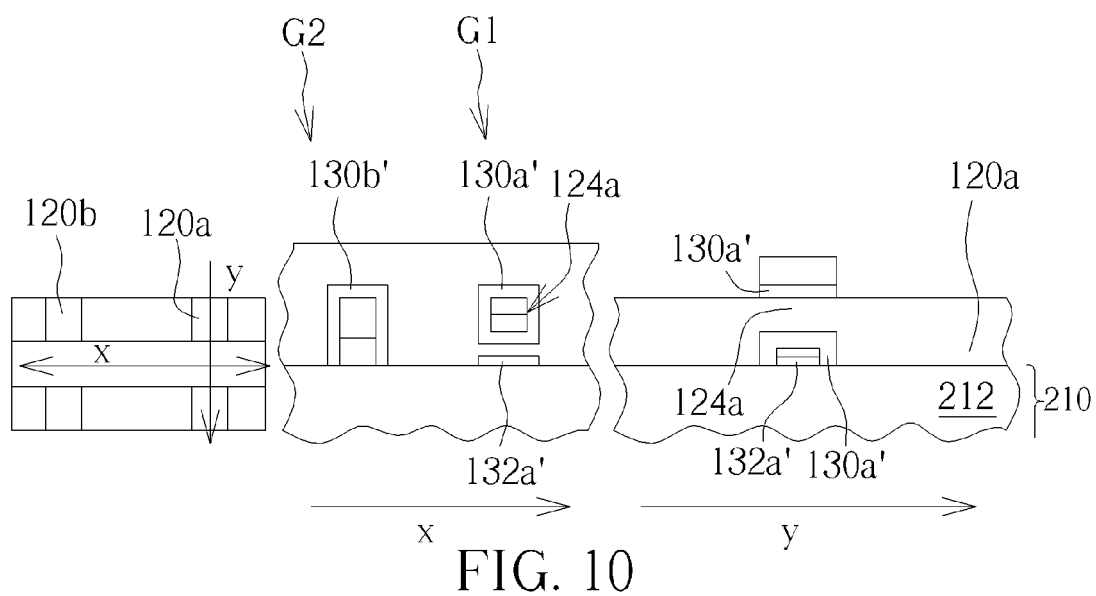
FIG. 10 schematically depicts a top view and a cross-sectional view of a semiconductor structure using a bulk substrate according to an embodiment of the present invention.

The aforesaid substrate 110 is a silicon-on-insulator (SOI) substrate. In another embodiment, the substrate 110 may be a bulk substrate. FIG. 10 schematically depicts a top view and a cross-sectional view of a semiconductor structure using a bulk substrate according to an embodiment of the present invention (which can be compared with FIG. 8 of the previous embodiment). In this embodiment, before the fin-shaped structures 120a and 120b are formed, an anti-punch process (not shown) may be performed in the substrate 210 to isolate a top part 212 of the bulk substrate downwards, and the top part 212 having anti-punch dopants are disposed between the later formed fin-shaped structures 120a and 120b and the substrate 210 without anti-punching. Then, process steps similar to those of the previous embodiment can be performed. However, due to the part 212 still being a silicon substrate in this embodiment, an insulating layer 132a' will be formed on the top part 212 right below the suspended part 124a during the formation of the dielectric layer 130a'. In other words, after the dielectric layer 130a is entirely covered and patterned, the part of the dielectric layer 130a on the top part 212 right below the suspended part 124 will be reserved so as to form the insulating layer 132a'. Thus, the insulating layer 132a' and the dielectric layer 130a' can be formed into one piece, i.e. a closed rectangular frame shaped cross-sectional profile along the direction y can be formed.

To summarize, the present invention provides a semiconductor structure and process thereof, which removes parts of a fin-shaped structure to form a through hole for forming a suspended part of the fin-shaped structure correspondingly above the through hole; then, a gate surrounding the suspended part is formed, thereby forming a semiconductor structure having four gate channels (or six or eight gate channels when forming chamfers). Moreover, a formed semiconductor structure such as a multi-gate MOSFET can achieve desired electrical requirements by adjusting the depth and the width of the suspended part.

Moreover, a four gate channels MOSFET (or a six or eight gate channels MOSFET when forming chamfers) of the present invention can be paired with other MOSFETS to form a semiconductor layout. For example, when the four gate channels MOSFET (or a six or eight gate channels MOSFET) of the present invention is formed together with a dual or three gate channels MOSFET, these MOSFETs are preferably to be formed on the same level, thereby enhancing the uniformity of the processes for each structure, and improving the electrical performances and the reliability of a formed semiconductor structure. Furthermore, specific electrical requirements can be achieved by adjusting the depth and the width of the suspended part. Thus, a formed semiconductor structure can have a smaller size and a better layout flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a fin-shaped structure located in a substrate along y direction, wherein the fin-shaped structure has a through hole located right below a suspended part, wherein the suspended part has a same width along the x direction as that of the fin-shaped structure other than the suspended part, and a bottom surface of the suspended part has two chamfers, a top surface of the suspended part is wider than the bottom surface of the suspended part along the x direction, and vertical sidewalls of the suspended part connect the two chamfers with sharp corners; and
    a gate surrounding the suspended part.

2. The semiconductor structure according to claim 1, wherein the substrate comprises a silicon-on-insulator (SOI) substrate or a bulk substrate.

3. The semiconductor structure according to claim 1, wherein the substrate comprises an insulating layer located right below the suspended part.

4. The semiconductor structure according to claim 1, further comprising:
    a source/drain located in the fin-shaped structure beside the gate.

5. The semiconductor structure according to claim 1, wherein the gate comprises a polysilicon gate or a metal gate.

6. The semiconductor structure according to claim 1, wherein the gate comprises a dielectric layer and an electrode layer.

7. The semiconductor structure according to claim 1, wherein the gate fills the through hole.

8. The semiconductor structure according to claim 1, wherein the semiconductor structure comprises two fin-shaped structures, but only one of the two fin-shaped structures has the through hole located right below the suspended part.

9. A semiconductor process, comprising:
    providing a substrate;
    forming a fin-shaped structure in the substrate along y direction, wherein the fin-shaped structure has a bottom part and a top part;
    removing a part of the bottom part, so that a suspended part in the corresponding top part is formed over a through hole, wherein the suspended part has same width along x direction as that of the fin-shaped structure other than the suspended part, a bottom surface of the suspended part has two chamfers, a top surface of the suspended part is wider than the bottom surface of the suspended part along the x direction, and vertical sidewalls of the suspended part connect the two chamfers with sharp corners; and
    forming a gate surrounding the suspended part.

10. The semiconductor process according to claim 9, wherein the substrate comprises a silicon-on-insulator (SOI) substrate or a bulk substrate.

11. The semiconductor process according to claim 10, further comprising:
    performing an anti-punch process in the substrate before the fin-shaped structure is formed to isolate a top part of the bulk substrate downward.

12. The semiconductor process according to claim 9, further comprising:
    performing a transformation process before the part of the bottom part is removed to transform the part of the bottom part.

13. The semiconductor process according to claim 12, wherein the transformation process comprises an ion implantation process.

14. The semiconductor process according to claim 13, wherein the ion implantation process comprises a germanium ion implantation process.

15. The semiconductor process according to claim 12, further comprising:
    forming a patterned photoresist before the transformation process is performed to cover the substrate and the fin-shaped structure but exposing the part of the bottom part.

16. The semiconductor process according to claim 9, wherein the part of the bottom part is removed by performing an etching process.

17. The semiconductor process according to claim 16, wherein the etching process comprises a dry etching process containing fluorine.

18. The semiconductor process according to claim 9, further comprising:
    forming a source/drain in the fin-shaped structure beside the gate after the gate is formed.

19. The semiconductor process according to claim 9, wherein the gate comprises a polysilicon gate or a metal gate.

* * * * *